US011521956B2

(12) United States Patent
Abe et al.

(10) Patent No.: US 11,521,956 B2
(45) Date of Patent: Dec. 6, 2022

(54) METHOD OF MANUFACTURING LIGHT-EMITTING DEVICE

(71) Applicant: NICHIA CORPORATION, Anan (JP)

(72) Inventors: Shogo Abe, Tokushima (JP); Yuki Ogura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 134 days.

(21) Appl. No.: 17/207,595

(22) Filed: Mar. 19, 2021

(65) Prior Publication Data

US 2021/0305217 A1 Sep. 30, 2021

(30) Foreign Application Priority Data

Mar. 31, 2020 (JP) .............................. JP2020-063174
Mar. 4, 2021 (JP) .............................. JP2021-034079

(51) Int. Cl.
*H01L 25/075* (2006.01)
*H01L 33/50* (2010.01)
(Continued)

(52) U.S. Cl.
CPC ........ *H01L 25/0753* (2013.01); *F21S 41/151* (2018.01); *F21S 45/10* (2018.01); *H01L 33/50* (2013.01); *H01L 33/54* (2013.01); *H01L 33/60* (2013.01); *H01L 33/62* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC ...... H01L 25/0753; F21S 45/10; F21S 41/151
See application file for complete search history.

(56) References Cited

U.S. PATENT DOCUMENTS

2008/0111249 A1  5/2008  Miyazaki
2015/0262987 A1  9/2015  Wada et al.
(Continued)

FOREIGN PATENT DOCUMENTS

JP    H09-232347 A    9/1997
JP    2003-007737 A   1/2003
(Continued)

*Primary Examiner* — Marcos D. Pizarro
*Assistant Examiner* — Antonio B Crite
(74) *Attorney, Agent, or Firm* — Global IP Counselors, LLP

(57) ABSTRACT

A method of manufacturing a light-emitting device includes: providing a first intermediate structure including a substrate, light-emitting elements arrayed in a first direction, a protective element, and light-transmissive members; forming a resin wall including first and second walls extending in the first direction, and third and fourth walls, a first distance between the first wall and the light-emitting elements being larger than a second distance between the third or fourth wall and a corresponding one of light-emitting elements; applying a first resin to a first region between the first wall and the light-emitting elements in which the protective element is disposed, resulting in forming a first recess in the first region and a second recess in a second region between the second wall and the light-emitting elements; and forming a covering member by applying a second resin to the first and second recesses and curing the first and second resins.

10 Claims, 7 Drawing Sheets

(51) Int. Cl.
   *H01L 33/54*     (2010.01)
   *H01L 33/60*     (2010.01)
   *H01L 33/62*     (2010.01)
   *H01L 33/56*     (2010.01)
   *H01L 33/48*     (2010.01)
   *F21S 41/151*    (2018.01)
   *F21S 45/10*     (2018.01)
   *F21S 41/19*     (2018.01)
   *H01L 25/16*     (2006.01)

(56) References Cited

U.S. PATENT DOCUMENTS

| | | |
|---|---|---|
| 2017/0025572 A1 | 1/2017 | Shichijo et al. |
| 2017/0154880 A1* | 6/2017 | Ozeki ................... H01L 24/96 |
| 2017/0358724 A1 | 12/2017 | Shichijo et al. |
| 2018/0033926 A1 | 2/2018 | Nonogawa |
| 2018/0040776 A1 | 2/2018 | Yamada et al. |

FOREIGN PATENT DOCUMENTS

| | | |
|---|---|---|
| JP | 2008-124140 A | 5/2008 |
| JP | 2008-130636 A | 6/2008 |
| JP | 2008-193016 A | 8/2008 |
| JP | 2009-182307 A | 8/2009 |
| JP | 2010-192629 A | 9/2010 |
| JP | 2010-283281 A | 12/2010 |
| JP | 2015-188053 A | 10/2015 |
| JP | 2017-028124 A | 2/2017 |
| JP | 2017-108092 A | 6/2017 |
| JP | 2017-224691 A | 12/2017 |
| JP | 2018-019032 A | 2/2018 |

\* cited by examiner

METHOD OF MANUFACTURING LIGHT-EMITTING DEVICE

CROSS-REFERENCE TO RELATED APPLICATION

This application claims priority to Japanese Patent Application No. 2020-063174 filed on Mar. 31, 2020, and Japanese Patent Application No. 2021-034079 filed on Mar. 4, 2021, the entire contents of which are hereby incorporated herein by reference.

BACKGROUND OF THE INVENTION

1. Field of the Invention

The present disclosure relates to a method of manufacturing a light-emitting device.

2. Description of Related Art

In recent years, high-output light-emitting devices using light-emitting elements such as LEDs has been used as light sources for vehicles, and methods of manufacturing light-emitting devices having various characteristics have been proposed. For example, a method of manufacturing a high-output light-emitting device used as a light source for a vehicle has been proposed in which a light-reflective resin covers an upper surface of a light-transmissive member or completely covers a protective element using the light-reflective resin and a void of a light-reflective resin is prevented (for example, Japanese Unexamined Patent Application Publication No. 2015-188053).

SUMMARY

An object of the present application is to provide a method of manufacturing a light-emitting device in which a covering member can be precisely disposed in a desired region of the light-emitting device.

A method of manufacturing a light-emitting device according to one embodiment of the present disclosure includes: providing a first intermediate structure including a substrate, a plurality of light-emitting elements arrayed on an upper surface of the substrate in a first direction, a protective element disposed on the upper surface of the substrate, the protective element being spaced apart from an array of the light-emitting elements in a second direction orthogonal to the first direction and facing the array of the light-emitting elements, and a plurality of light-transmissive members respectively bonded to upper surfaces of the light-emitting elements, forming a resin wall on the substrate to surround the light-emitting elements and the protective element, the resin wall including a first wall and a second wall extending along the first direction, and respectively disposed on sides of the array of the light-emitting elements with respect to the second direction with the protective element being disposed between the first wall and the array of the light emitting elements, and a third wall and a fourth wall extending between the first wall and the second wall along the second direction, and respectively disposed on sides of the array of the light emitting elements with respect to the first direction, a first distance between the first wall and the array of the light-emitting elements is larger than a second distance between the third wall and a corresponding one of the light-emitting elements facing the third wall or between the fourth wall and a corresponding one of the light-emitting elements facing the fourth wall; applying a first resin to a first region between the first wall and the array of the light-emitting elements, in which the protective element is disposed, along the first direction to allow the first resin to move through gaps between the third wall and the corresponding one of the light-emitting elements, between the fourth wall and the corresponding one of the light-emitting elements, between adjacent ones of the light-emitting elements, and between the light-emitting elements and the substrate, resulting in forming a first recess in the first region and a second recess in a second region between the second wall and the array of the light-emitting elements, each of the first recess and the second recess being defined by inner lateral surfaces each constituted of the first resin or the resin wall; and forming a covering member covering lateral surfaces of the light-transmissive members by applying a second resin to the first recess and the second recess and curing the first resin and the second resin.

In a method of manufacturing a light-emitting device of the present application, a covering member can be precisely disposed in a desired region of the light-emitting device.

DETAILED DESCRIPTION OF EMBODIMENT

Figure 1A:
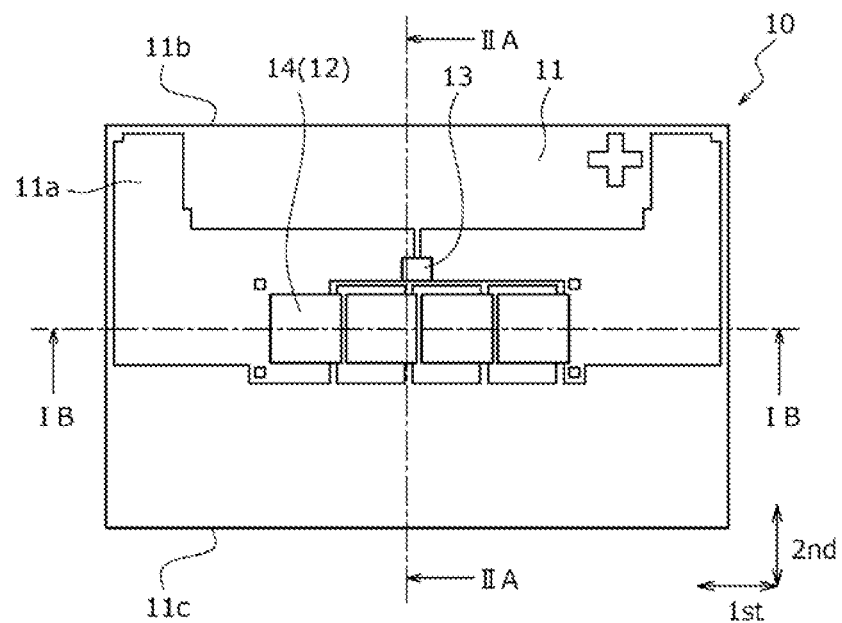
FIG. 1A is a schematic plan view illustrating a method of manufacturing a light-emitting device according to one embodiment of the present invention.

Certain embodiments of the present disclosure will be described below with reference to the accompanying drawings. The embodiment described below is intended to embody the technical idea of the present disclosure and is not intended to limit the present disclosure to the embodiments below unless specifically stated otherwise. The sizes, positional relationships, and the like of members shown in the drawings may be exaggerated for clarity of descriptions. The cross-sectional views may be cross-sectional end views showing only cross sections of members. A member in an embodiment designated as the same name as in another embodiment indicates the same or corresponding member. A material, size, and the like of such a member may be the same as such another embodiment unless otherwise described. Terms such as "up/upper" and "down/lower" in the present specification are not intended to represent absolute positions unless otherwise specified but represent relative positions between components in drawings referred to for the purpose of illustration. Each of a first direction and a second direction may be any of directions indicated by double-headed arrows in the drawings. A term "distance" as used in the present specification refers to a distance between surfaces closest to each other among surfaces of corresponding members.

Method of Manufacturing Light-Emitting Device

A method of manufacturing a light-emitting device according to one embodiment of the present application includes: providing a first intermediate structure including a substrate, a plurality of light-emitting elements arrayed on an upper surface of the substrate in a first direction, a protective element disposed on the upper surface of the substrate, the protective element being spaced apart from an array of the light-emitting elements in a second direction orthogonal to the first direction and facing the array of the light-emitting elements, and a plurality of light-transmissive members respectively bonded to upper surfaces of the light-emitting elements, forming a resin wall on the substrate to surround the light-emitting elements and the protective element, the resin wall including a first wall and a second wall extending along the first direction, and respectively disposed on sides of the array of the light-emitting elements with respect to the second direction with the protective element being disposed between the first wall and the array of the light emitting elements, and a third wall and a fourth wall extending between the first wall and the second wall along the second direction, and respectively disposed on sides of the array of the light emitting elements with respect to the first direction, a first distance between the first wall and the array of the light-emitting elements is larger than a second distance between the third wall and a corresponding one of the light-emitting elements facing the third wall or between the fourth wall and a corresponding one of the light-emitting elements facing the fourth wall; applying a first resin to a first region between the first wall and the array of the light-emitting elements, in which the protective element is disposed, along the first direction to allow the first resin to move through gaps between the third wall and the corresponding one of the light-emitting elements, between the fourth wall and the corresponding one of the light-emitting elements, between adjacent ones of the light-emitting elements, and between the light-emitting elements and the substrate, resulting in forming a first recess in the first region and a second recess in a second region between the second wall and the array of the light-emitting elements, each of the first recess and the second recess being defined by inner lateral surfaces each constituted of the first resin or the resin wall; and forming a covering member covering lateral surfaces of the light-transmissive members by applying a second resin to the first recess and the second recess and curing the first resin and the second resin.

In this method of manufacturing a light-emitting device, wet-spreading of the resin member over a light extracting surface of the light-emitting device can be reduced, and formation of voids due to movement of the resin member can be reduced. That is, in the method of manufacturing a light-emitting device according to the present embodiment, a resin member can be precisely disposed in a desired region of the light-emitting device.

Providing First Intermediate Structure 10

Figure 1B:
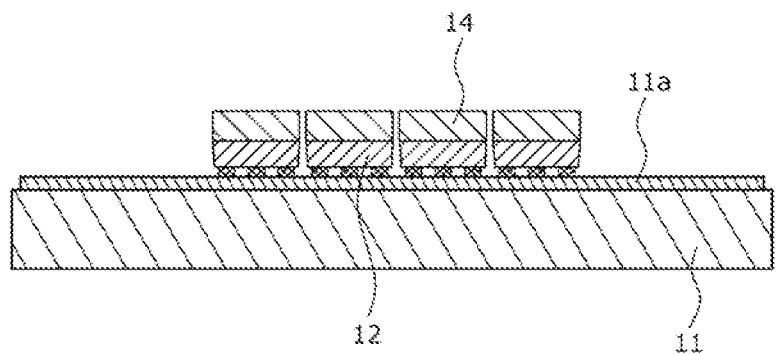
FIG. 1B is a schematic cross-sectional view taken along the line IB-IB of FIG. 1A.

For example, as shown in FIGS. 1A and 1B, a first intermediate structure 10 includes a substrate 11, a plurality of light-emitting elements 12 arrayed on an upper surface of the substrate 11 in a first direction, a protective element 13 disposed on the upper surface of the substrate 11 spaced apart from the array of the light-emitting elements 12 in a second direction orthogonal to the first direction and face the array of the light-emitting elements 12, and one or more light-transmissive members 14 bonded to upper surfaces of respective light-emitting elements 12.

Substrate 11

Figure 4:
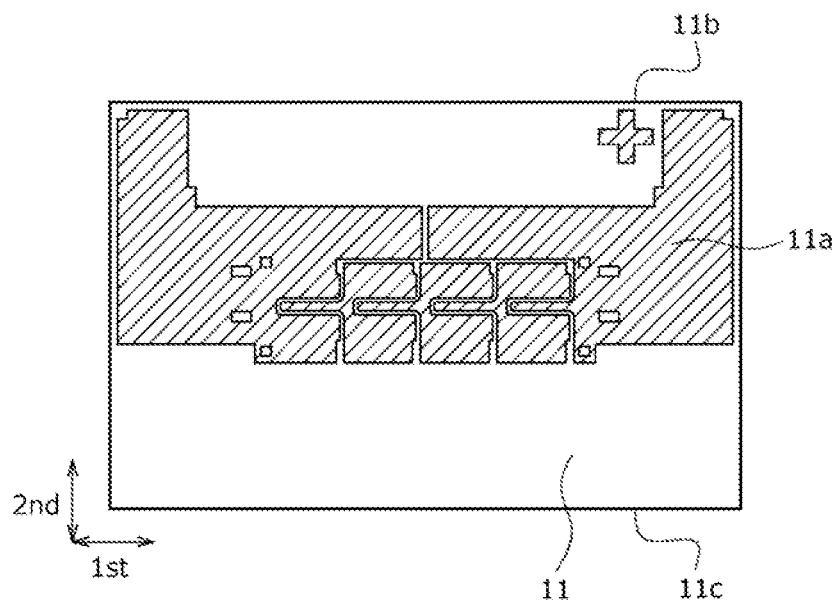
FIG. 4 is a schematic plan view of a substrate used in the method of manufacturing a light-emitting device according to one embodiment of the present invention.

The substrate 11 is a member that supports the light-emitting elements 12 and other components. For example, as shown in FIG. 4, the substrate 11 has, at least on its surface, two or more wirings 11a electrically connected to electrodes of the light-emitting elements 12.

In a plan view, the substrate 11 can have various shapes such as circular shapes, elliptic shapes, polygonal shapes such as quadrangular shapes and hexagonal shapes, and polygonal shapes with rounded corners in a plan view. Among these shapes, rectangular shapes are preferable. The size of the substrate 11 can be appropriately adjusted according to the size or number of the light-emitting elements 12 to be disposed on the substrate 11 or desired performance.

The shapes of the wirings 11a in a plan view can be appropriately set according to the size and number of the light-emitting elements to be disposed on the wirings 11a. For example, as shown in FIG. 4, the wirings 11a are preferably disposed predominantly at a region between the center of the width (or the length in the second direction in FIG. 4) of the substrate 11 and a first side 11b of the substrate 11. In other words, it is preferable that the wirings 11a be disposed predominantly at a region close to the first side 11b of the substrate 11 with respect to the center line of the substrate 11 in the second direction in a plan view.

For a main material of the substrate 11, an insulating material that does not easily transmit light emitted from the light-emitting elements 12 and extraneous light is preferably used. Examples of such a material include ceramics, such as aluminum oxide and aluminum nitride, and resins, such as phenolic resins, epoxy resins, silicone resins, polyimide resins, BT resins, and polyphthalamide. In the case in which a resin is used, an inorganic filler, such as glass fiber, silicon oxide, titanium oxide, and aluminum oxide, may be mixed with the resin when appropriate. This allows for improving the mechanical strength and the light reflectance and reduce the thermal expansion coefficient. The substrate 11 may be a metal member provided with an insulating material on a surface of the metal member.

The wirings 11a are disposed on the insulating material and have a predetermined pattern. Examples of the material of the wirings include metals such as Au, Ag, Cu, Fe, Ti, Pd, Ni, Cr, Pt, W, and Al and alloys containing any of these metals. The wirings can be formed by plating, vapor deposition, sputtering, or the like. For example, in the case in which Au is used for bonding members that bond the light-emitting elements to the substrate, which will be described below, it is preferable to use Au for the outermost surfaces of the wirings 11a to improve the bondability.

Light-Emitting Element 12

A plurality of light-emitting elements 12 are disposed on the upper surface of the substrate 11. In this case, the light-emitting elements 12 may be arranged in a single row in the first direction or may be arranged in a matrix. In particular, the light-emitting elements 12 is preferably arranged in a single row, and more preferably arranged in a single row in the first direction as shown in FIG. 1A. This arrangement allows for obtaining a light-emitting device 20 having an oblong light distribution pattern, which is suitable for a vehicle headlight. For example, in the case in which the substrate 11 has an oblong rectangular shape in a plan view as described above, the direction in which the long sides extend is regarded as the first direction, and the light-emitting elements are preferably arranged in a single row in the first direction.

The light-emitting elements are preferably arranged in a single row at regular intervals.

In a plan view, the light-emitting elements 12 can have various shapes such as circular shapes, elliptic shapes, polygonal shapes such as quadrangular shapes and hexagonal shapes, and polygonal shapes with rounded corners. Among these shapes, quadrangular shapes are preferable, and rectangular shapes are more preferable. With such shapes, the light-emitting elements 12 can be arranged closely to each other in the first direction with regular distances between lateral surfaces of adjacent light-emitting elements, and an oblong rectangular emission surface as a whole in a plan view can be formed.

The light-emitting elements can have any appropriate length, width, and height. In particular, large light-emitting elements are preferably used for obtaining a higher-output light-emitting device. The length and width of the light-emitting elements are preferably 600 μm or more, more preferably 1,000 μm or more in a plan view. The length and width are preferably 2,000 μm or less in view of uniformity of the emission intensity, mountability, and the like.

The light-emitting elements 12 are disposed spaced apart from their respective adjacent light-emitting elements 12. The distance between the light-emitting elements 12 in this case is in the range of, for example, 0.1 to 0.5 times the length of one side of the light-emitting elements 12 along the first direction. Specifically, in the case in which light-emitting elements 12 each having a substantially square shape with a length and width of about 1,000 μm in a plan view are used, the distance between adjacent light-emitting elements 12 is in the range of, for example, 100 μm to 500 μm.

A light-emitting diode is preferably used for each light-emitting element 12. Light-emitting elements with any appropriate wavelength can be selected for the light-emitting elements 12. Examples of a blue or green light-emitting element include a light-emitting element using a nitride semiconductor ($In_XAl_YGa_{1-X-Y}N$, where $0 \leq X$, $0 \leq Y$, and $X+Y \leq 1$), ZnSe, or GaP. For a red light-emitting element, GaAlAs, AlInGaP, or the like can be used. Semiconductor light-emitting elements made of other materials can also be used. The composition, emission color, size, or number of the light-emitting elements to be used can be appropriately selected according to the purpose. For a light-emitting device including a phosphor, it is preferable to use light-emitting elements containing a nitride semiconductor adapted to emit short-wavelength light that can efficiently excite the phosphor.

Each light-emitting element 12 is formed by, for example, layering a semiconductor layer on a light-transmissive supporting substrate such as a sapphire growth substrate, and the supporting substrate serves as a main light emission surface of the light-emitting element 12. The supporting substrate may be removed by, for example, abrasion or laser lift off.

For example, the light-emitting element 12 preferably has a first electrode and second electrodes on the same surface side, that is, at a side opposite to the light emission surface. For example, in the light-emitting element 12, the first electrode is disposed on a central portion, and the second electrodes are disposed on both sides of the first electrode.

The light-emitting element 12 is disposed on the substrate 11 such that a surface of the light-emitting element 12 provided with the electrodes serves as the lower surface and faces the substrate 11. More specifically, the first electrodes or the second electrodes of the light-emitting elements 12 are connected to the wirings 11a on the substrate 11 through respective bonding members.

Examples of the bonding members include: bumps made of Au, Ag, Cu, or an alloy containing any of these metals; Sn—Bi-based solders, Sn—Cu-based solders, Sn—Ag-based solders, and Au—Sn-based solders; eutectic alloys such as an alloy containing Au and Sn as main components, an alloy containing Au and Si as main components, and an alloy containing Au and Ge as main components; electrically-conductive pastes of Au, Ag, and Pd; anisotropic conductive materials such as ACP and ACF; brazing materials of low-melting-point metals; electrically-conductive adhesives using a combination of two or more of these materials; and electrically-conductive composite adhesives. Among these materials, bumps are preferable in view of the accuracy of position. In view of the bond strength and heat dissipation performance, each of the first electrode and the second electrode is preferably connected to the substrate 11 through a plurality of bumps.

In the case in which the light-emitting elements are bonded to the wirings via the bonding members such as bumps, gaps corresponding to the thickness of the bonding members are left between the substrate and the light-emitting elements. In this case, the light-reflective first resin described below is disposed in the gaps, which allows light traveling from the light-emitting elements toward the substrate to be reflected, so that extraction of the light can be facilitated.

Considering the region described below in which the protective element 13 is to be disposed, on the wirings 11a of the substrate 11, the light-emitting elements 12 are preferably disposed at, for example, positions offset from the center of the width of the wirings 11a in the second direction toward the side opposite to the region in which the protective element 13 is disposed. In particular, in the case in which the wirings 11a are disposed predominantly at the region close to the first side 11b of the substrate 11 as described above as shown in FIG. 4, the light-emitting elements 12 are preferably disposed predominantly at a region on the wirings 11a close to a second side 11c opposite to the first side 11b of the substrate 11. This arrangement allows the light-emitting elements 12 to be disposed on the substrate 11 along the first direction and to be disposed at a central region of the substrate 11 in the second direction as shown in FIG. 1A while securing region in which the protective element 13 is disposed, on the first side 11b of the substrate 11. In this arrangement of the light-emitting elements 12 on the wirings 11a, the area of the wirings 11a differs between the region close to the first side 11b and the region close to the second side 11c of the substrate 11 opposite to each other across the light-emitting elements 12. More specifically, the area of portions of the wirings 11a in the region close to the first side 11b of the substrate 11, in which the protective element 13 is disposed, with respect to the light-emitting elements 12 arranged in the single row is larger than the area of portions of the wirings 11a in the region at the second side 11c side with respect to the light-emitting elements 12 arranged in the single row.

Protective Element 13

The protective element 13 is disposed on the upper surface of the substrate to be spaced apart from the light-emitting elements 12 in the second direction orthogonal to the first direction and face the light-emitting elements 12 as shown in FIG. 1A. The distance between the light-emitting elements 12 and the protective element 13 is in the range of, for example, 0.1 to 0.5 times the length of one side of the light-emitting elements 12 along the second direction.

Further, the protective element 13 is preferably disposed substantially at the center in the first direction of the row of the light-emitting elements arranged in the first direction. This structure allows the first resin described below to be uniformly spread along the protective element toward both ends of the row of the light-emitting elements.

Examples of the protective element 13 include a condenser, a varistor, a Zener diode, and a bridge diode.

Figure 2A:
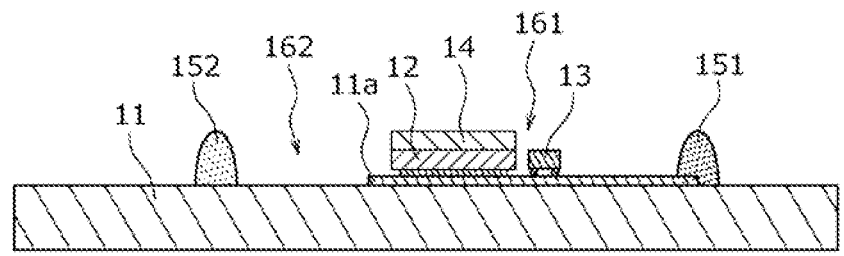
FIG. 2A is a schematic cross-sectional view of FIG. 1C taken along a direction indicated by the line IIA-IIA of FIG. 1A, illustrating the method of manufacturing a light-emitting device according to one embodiment of the present invention.

The protective element 13 is preferably disposed such that a lateral surface of the protective element 13 faces lateral surfaces of the light-emitting elements 12 as shown in FIG. 1A, FIG. 2A, and other drawings. Accordingly, lateral surfaces of the light-emitting elements 12 and a lateral surface of the protective element 13 that face each other can be located close to each other at a constant distance. Further, the first resin described below easily move toward the light-emitting elements along the gap between the lateral surfaces of the light-emitting elements 12 and the lateral surface of the protective element 13 that face each other.

For example, the protective element 13 has a substantially rectangular shape in a plan view. The length, width, and height of the protective element can be appropriately set. In particular, in order to miniaturize the light-emitting device, the length and width of the protective element are preferably smaller than the length and width of each light-emitting element in a plan view. The height of the protective element is preferably smaller than the total height of the light-emitting element and the light-transmissive member.

Light-Transmissive Member 14

The light-transmissive members 14 are bonded to the upper surfaces of the light-emitting elements 12. The light-transmissive members 14 transmit light emitted from the light-emitting elements 12 and emit the light to the outside. Examples of the light-transmissive members 14 include members that transmit 60% or more, preferably 70% or more, of light (such as light with wavelengths in the range of 320 nm to 850 nm) emitted from the light-emitting elements 12. Also, plate-shaped members are preferable.

More specifically, each light-transmissive member 14 has, for example, a first surface, a second surface opposite to the first surface, and lateral surfaces between the first surface and the second surface. The first surface corresponds to the light extracting surface of the light-emitting device 20. The second surface is bonded to the upper surface of the light-emitting element 12. The first surface and the second surface are preferably flat and are more preferably parallel to each other. The lateral surfaces may be perpendicular surfaces perpendicular to the first surface and/or the second surface or may include inclined surfaces inclined with respect to the first surface and/or the second surface. The light-transmissive member 14 may have a step between the first surface and the second surface.

The second surface of the light-transmissive member 14 preferably has an area about 0.8 to 1.5 times as large as the area of the upper surface of the light-emitting element 12. The outer edges of the second surface of the light-transmissive member preferably coincide with the outer edges of the upper surface of the light-emitting element or are preferably located only inward or outward of the outer edges of the upper surface of the light-emitting element. That is, either one of the upper surface of the light-emitting element or the second surface of the light-transmissive member is preferably located inward of the other one of the upper surface of the light-emitting element or the second surface of the light-transmissive member in a plan view.

The thickness of the light-transmissive member 14 can be in the range of, for example, 50 μm to 300 μm.

The light-transmissive member 14 can be bonded to the light-emitting element 12 with a light-transmissive adhesive or the like as commonly used in the field of the invention. The light-transmissive member 14 can be directly bonded to the light-emitting element 12 using compression, surface-activated bonding, atomic diffusion bonding, or hydroxy group bonding.

For example, the light-transmissive member 14 may be made of an inorganic material such as glass, ceramic, and sapphire or an organic material such as a resin or a hybrid resin containing one or more of a silicone resin, a modified silicone resin, an epoxy resin, a modified epoxy resin, an acrylic resin, a phenolic resin, and a fluorocarbon resin.

The light-transmissive member 14 may contain a light-diffusing material and a phosphor adapted to convert the wavelength of at least a portion of the incident light. Examples of the light-transmissive member containing a phosphor include a sintered body of a phosphor and a mixture of a phosphor and a substance such as resin, glass, ceramic, and other inorganic substances. Alternatively, for the light-transmissive member 14, a molded body made of resin, glass, or ceramic and provided with a resin layer containing a phosphor on a surface of the molded body can be used.

A phosphor adapted to be excited by light emitted from the light-emitting element 12 is used for the phosphor. Examples of a phosphor adapted to be excited by a blue or ultraviolet light-emitting element include cerium-activated yttrium-aluminum-garnet phosphors (YAG:Ce); cerium-activated lutetium-aluminum-garnet phosphors (LAG:Ce); europium- and/or chromium-activated nitrogen-containing calcium aluminosilicate phosphors ($CaO-Al_2O_3-SiO_2$:Eu and/or Cr); europium-activated silicate phosphors ((Sr,Ba)$_2SiO_4$:Eu); nitride phosphors such as β-SiAlON phosphors, CASN phosphors represented by $CaAlSiN_3$:Eu, and SCASN phosphors represented by (Sr,Ca)$AlSiN_3$:Eu; KSF phosphors represented by $K_2SiF_6$:Mn; sulfide phosphors; and quantum-dot phosphors. Combining such a phosphor and a blue or ultraviolet light-emitting element allows for manufacturing a light-emitting device configured to emit light having a desired color (a light-emitting device that emits white light).

For the light-diffusing material, any of materials commonly used in the field of the invention, such as titanium oxide, barium titanate, aluminum oxide, silicon oxide, zirconium oxide, Aerosil, glass, fillers such as glass fiber or wollastonite, or aluminum nitride, can be used.

Forming Resin Wall

Figure 1C:
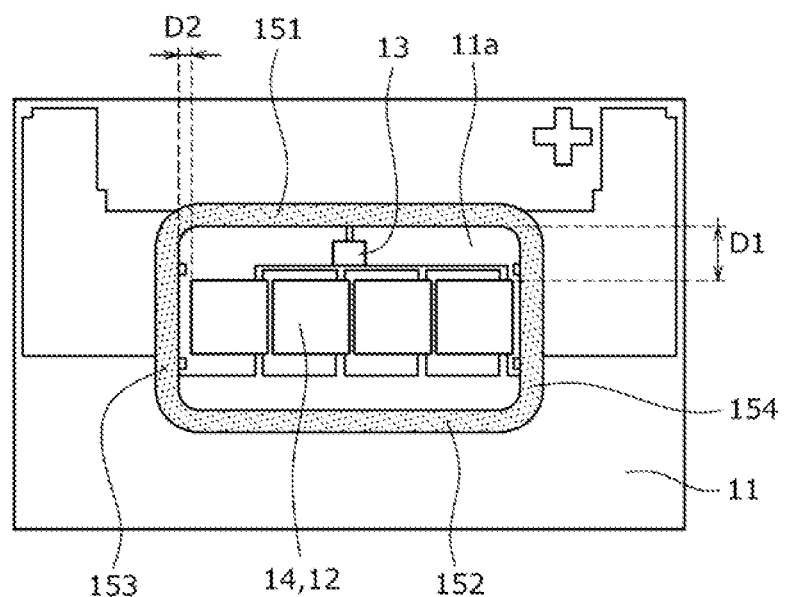
FIG. 1C is a schematic plan view illustrating the method of manufacturing a light-emitting device according to one embodiment of the present invention.
Figure 1D:
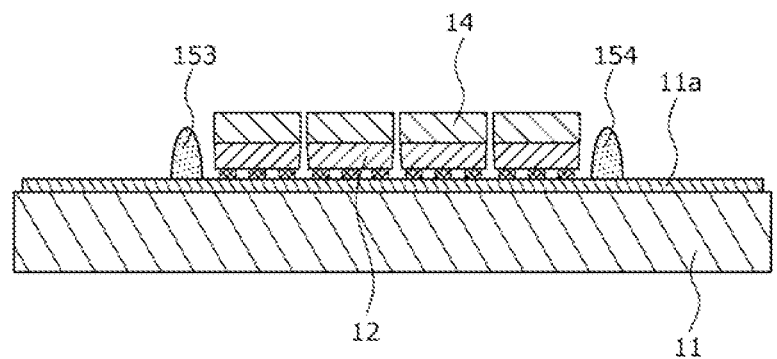
FIG. 1D is a schematic cross-sectional view of FIG. 1C.

A resin wall 150 surrounding the protective element 13 and the array of the light-emitting elements 12 with the light-transmissive members 14 bonded to the upper surfaces of the light-emitting elements 12 is disposed on the substrate 11 as shown in FIGS. 1C and 1D. For example, in the case in which a plurality of light-emitting elements 12 are arranged in a single row in the first direction on the substrate 11 having a rectangular shape in a plan view, the resin wall preferably has a substantially rectangular frame shape surrounding the light-emitting elements 12.

The resin wall includes a first wall 151 and a second wall 152 that are respectively disposed on both sides of the array of the light-emitting elements 12 on which the light-transmissive members 14 have been bonded and that extend in the first direction, and a third wall 153 and a fourth wall 154 that are disposed between the first wall 151 and the second wall 152 and that extend in the second direction as shown in FIG. 1C. The third wall 153 and the fourth wall 154 face each other across the array of the light-emitting elements 12. That is, the first wall 151, the second wall 152, the third wall 153, and the fourth wall 154 are disposed on the substrate 11 with spacing from the light-transmissive members 14, the light-emitting elements 12, and the protective element 13 so as to surround the protective element 13 and the light-emitting elements 12 on which the light-transmissive members 14 have been bonded. The first wall 151, the second wall 152, the third wall 153, and the fourth wall 154 are connected together to form a single frame-shaped resin wall on the substrate 11 to surround the protective element 13 and the array of the light-emitting elements 12 on which the light-transmissive members 14 have been bonded. In this case, the resin wall has an annular structure having a substantially rectangular shape in a plan view in which the first wall 151, the fourth wall 154, the second wall 152, and the third wall 153 are connected in this order as shown in FIG. 1C. The rectangular shape in this case may be a rounded rectangular shape; that is, the connecting portions between the first wall 151, the fourth wall 154, the second wall 152, and the third wall 153 may be curved.

The distance (represented by the reference numeral D1 in FIG. 1C, hereinafter may be referred to as a first distance) between the first wall 151 and the array of the light-emitting elements 12 is larger than the distance (represented by the reference numeral D2 in FIG. 1C, hereinafter may be referred to as a second distance) between the third wall 153 or the fourth wall 154 and a corresponding one of the light-emitting elements 12 facing the third wall 153 or the fourth wall 154 as shown in FIG. 1C. In other words, a region (represented by the reference numeral 161 in FIG. 1E, hereinafter may be referred to as a first region) between the first wall 151 and the array of the light-emitting elements 12 is larger than a region between the third wall 153 or the fourth wall 154 and the light-emitting elements 12. The distance between the first wall 151 and the array of the light-emitting elements 12 may be different from, preferably equal to, the distance between the second wall 152 and the array of the light-emitting elements 12. In other words, the first region 161 may be different from, preferably equal to, a region (represented by the reference numeral 162 in FIG. 1E, hereinafter may be referred to as a second region) between the second wall 152 and the array of the light-emitting elements 12. The first distance D1 is in the range of, for example, 0.5 to 1.5 times the length of one side of the light-emitting elements 12 along the first direction. More specifically, the first distance D1 can be in a range of 500 µm to 1,500 µm. The second distance D2 is, for example, equal to or larger than the distance between adjacent ones of the light-emitting elements 12 and preferably smaller than three times the distance between the adjacent ones of the light-emitting elements 12.

It is designed that the distance (the second distance D2) between the third wall 153 and a corresponding one of the light-emitting elements 12 facing the third wall 153 is equal to the distance between the fourth wall 154 and a corresponding one of the light-emitting elements 12 facing the fourth wall. Even when the light-emitting elements are the same in design, differences may occur due to, for example, variation in members and mounting during manufacture. The expression that the distances, widths, heights, or areas are "equal" as used in the present specification includes such differences, and does not necessarily indicate being exactly the same.

In order to cover a portion of the wirings 11a, the resin wall 150 is made of an insulating resin. The resin wall may be made of, for example, a light-transmissive resin, but is preferably made of a mixture of a resin and a light-reflective substance. The resin may be either one of a thermosetting resin or a thermoplastic resin. Specific examples of the resin include epoxy resins, silicone resins, modified epoxy resins, modified silicone resins, polyester resins, polyimide resins, modified polyimide resins, polyphthalamide (PPA), polycarbonate resins, poly(phenylene sulfide) (PPS), liquid crystal polymers (LCPs), ABS resins, phenolic resins, acrylic resins, and PBT resins. Among these resins, a thermosetting resin, such as epoxy resins and silicone resins, which have good resistance to heat and light, is preferable. For the light-reflective substance, a material that is less likely to absorb light emitted from the light-emitting elements and greatly differs in refractive index from the resin material is preferably used. Examples of such a light-reflective substance include titanium oxide, zinc oxide, silicon oxide, zirconium oxide, yttrium oxide, yttria-stabilized zirconia, potassium titanate, aluminum oxide, aluminum nitride, boron nitride, and mullite. The content of these light-reflective substances can be in the range of 5 wt % to 90 wt % relative to the resin. The viscosity of the mixture of the resin and the light-reflective substance constituting the resin wall is in the range of, for example, 200 Pa·s to 800 Pa·s, preferably 350 Pa·s to 450 Pa·s. The resin wall may be made of a mixture containing a resin and a light-absorbing substance such as carbon black and graphite.

The first wall 151, the second wall 152, the third wall 153, and the fourth wall 154 may all have the same height and width, or a portion of or all of the walls may have different heights and/or widths. In the case in which the walls have partially different heights and/or widths, two walls (specifically, the first wall 151 and the second wall 152, and the third wall 153 and the fourth wall 154) facing each other across the light-emitting elements 12 preferably have the same height and width. For example, the height of the resin wall 150 from the upper surface of the substrate 11 is preferably larger than the height of the upper surfaces of the light-emitting elements 12 as shown in FIG. 1D. A height between the upper surface of the substrate 11 and the top of the resin wall 150 may be larger than, but is preferably smaller than, a height between the upper surface of the substrate 11 and the upper surfaces of the light-transmissive members 14. For example, in the case in which the height and the upper surface of the substrate 11 and the upper surfaces of the light-transmissive members 14 is 350 µm, the height of the resin wall can be in the range of 150 µm to 300 µm. The resin wall 150 has a width (that is, the length of the base of the resin wall 150 in the direction orthogonal to the direction in which the resin wall extends) that allows the resin wall 150 to have enough strength to be stably disposed, and the width can be appropriately set according to the height, the material to be used, and the like. The width of the resin wall 150 is in the range of, for example, 200 μm to 600 μm.

The resin wall can be formed using, for example, a device known in the field of the invention, such as a discharging device (resin discharging device) that can continuously discharge a liquid resin at a constant flow rate using air pressure or the like (see Japanese Unexamined Patent Application Publication No. 2009-182307). In the case in which the discharging device is used, the resin wall 150 having a desired height and a desired width can be formed by adjusting the moving speed of a needle and the discharge quantity of the discharging device.

Forming First Recess and Second Recess

Figure 1E:
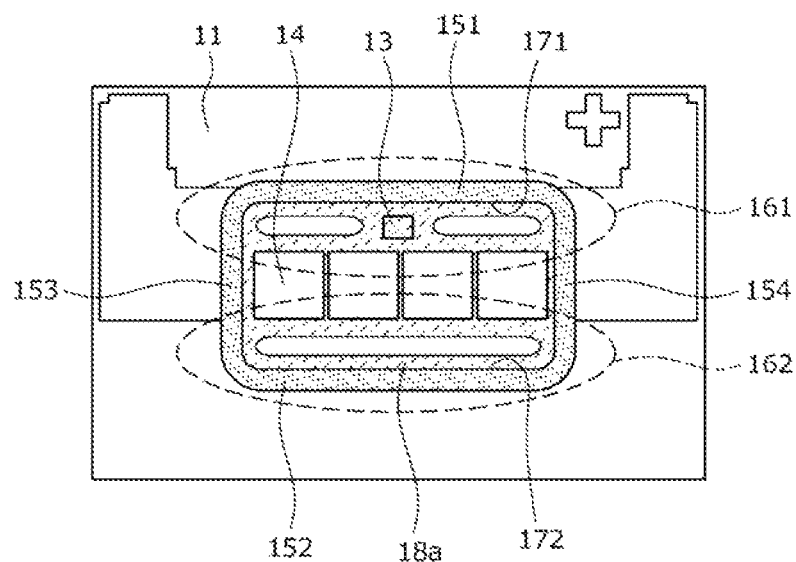
FIG. 1E is a schematic plan view illustrating the method of manufacturing a light-emitting device according to one embodiment of the present invention.
Figure 1F:
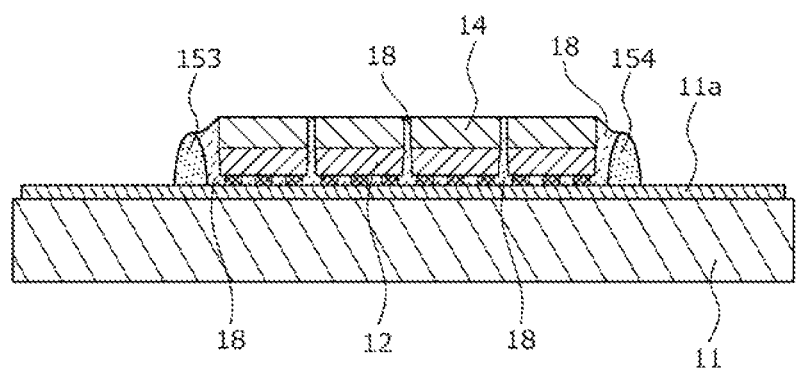
FIG. 1F is a schematic cross-sectional view of FIG. 1E.
Figure 2B:
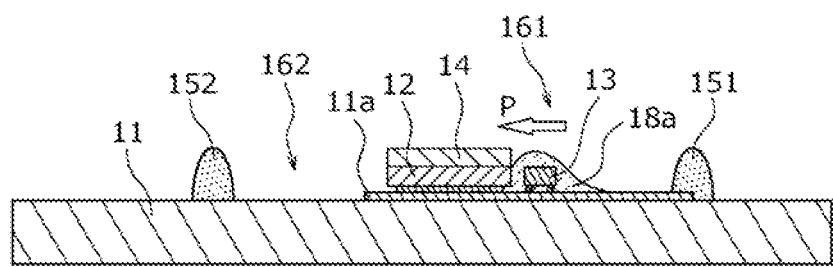
FIG. 2B is a schematic cross-sectional view illustrating the method of manufacturing a light-emitting device according to one embodiment of the present invention.
Figure 2C:
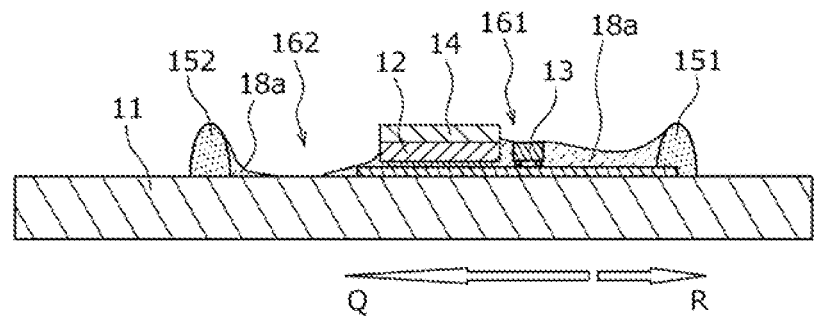
FIG. 2C is a schematic cross-sectional view illustrating the method of manufacturing a light-emitting device according to one embodiment of the present invention.

As shown in FIG. 2A and FIG. 2B, a first resin 18a is applied along the first direction to the first region 161 between the first wall 151 and the light-emitting elements 12 in which the protective element 13 has been disposed. The expression "along the first direction" as used herein may refer to a direction from the third wall 153 toward the fourth wall 154 or from the fourth wall 154 toward the third wall 153. In the case in which the application of the first resin 18a is performed a plurality of times, application from the third wall 153 toward the fourth wall 154 may be performed a plurality of times, application from the fourth wall 154 toward the third wall 153 may be performed a plurality of times, or both types of application may be combined. In this case, the first resin 18a is preferably applied over the protective element 13 to cover the protective element 13. Application of the first resin 18a at such a position allows the first resin 18a to easily move toward the light-emitting elements 12 along the protective element 13. Accordingly, the first resin 18a quickly moves in a direction indicated by the arrow P in FIG. 2B. Further, as shown in FIG. 2C, the first resin 18a moves in a direction indicated by the arrow Q through gaps between the third wall 153 and a corresponding one of the light-emitting elements 12 facing the third wall 153, between the fourth wall 154 and a corresponding one of the light-emitting elements 12 facing the fourth wall 154, between adjacent ones of the light-emitting elements 12, and between the light-emitting elements 12 and the substrate 11 toward the second region 162 along the third wall 153, the fourth wall 154, the light-emitting elements 12, the substrate 11, and/or the wirings 11a. At this time, between the light-emitting elements 12, the first resin 18a that has moved toward the light-emitting elements 12 creeps up the gaps between lateral surfaces of the light-emitting elements 12 facing each other and the gaps between lateral surfaces of the light-transmissive members 14 facing each other due to the capillary phenomenon, which results in the lateral surfaces of the light-emitting elements 12 and the light-transmissive members 14 being covered by the first resin 18a. Likewise, between the third and fourth walls and the respective light-emitting elements 12, the first resin 18a that has moved along the light-emitting elements 12 arrayed in the first direction creeps up the gaps between the lateral surfaces of the resin wall (the third wall 153 and the fourth wall 154) and the light-emitting elements 12 facing each other, which results in the lateral surfaces of the light-emitting elements 12, the lateral surfaces of the light-transmissive members 14, and the lateral surfaces of the resin wall (the third wall 153 and the fourth wall 154) being covered by the first resin 18a. The first resin 18a that has moved into the second region 162 spreads along the lateral surfaces of the second wall 152 and the light-emitting elements 12 as shown in FIG. 1E and FIG. 2C. Accordingly, a second recess 172 defined with inner lateral surfaces constituted of the first resin 18a or the resin wall can be formed in the second region 162. The bottom surface defining the second recess 172 can be constituted of the first resin 18a or may be a surface of the substrate exposed from the first resin 18a.

The first resin 18a applied to the first region 161 moves toward the light-emitting elements 12 and moves in a direction indicated by the arrow R in FIG. 2C from the protective element 13 toward the first wall 151 inside the first region 161 to spread along the first wall 151. Accordingly, a first recess 171 defined by inner lateral surfaces constituted of the first resin 18a or the resin wall can be formed in the first region 161. The bottom surface defining the first recess 171 may be constituted of the first resin 18a or may be a surface of the substrate exposed from the first resin 18a. The protective element is disposed in the first region, and a surface defining a bottom of the first recess 171 includes two surfaces between which the protective element 13 and a portion of the first resin 18a covering the protective element 13 are located, as shown in FIG. 1E.

In this manner, the first recess and the second recess defined by inner lateral surfaces constituted of the first resin or the resin wall can be formed in the first region and the second region on both sides of the light-emitting elements arrayed in the first direction in the region surrounded by the resin wall 150.

The protective element 13 is disposed in the first region 161, and the first resin applied to the first region covers the surface of the protective element 13. With this structure, even in the case in which the area dimensions of the first region 161 and the second region 162 on the substrate 11 are substantially the same, the amount of the first resin 18a moving into the second region is considered less than the amount of the first resin 18a remaining in the first region 161 with respect to the amount of the first resin 18a applied to the first region 161. Accordingly, the capacity of the first recess 171 is smaller than the capacity of the second recess 172 by the volume of the protective element 13 and the portion of the first resin 18a covering the protective element 13 as shown in FIG. 2C. The expression "amount of the first resin 18a applied to the first region 161" as used herein refers to the volume of the first resin, and the expression "amount of the first resin 18a moving into the second region" as used herein refers to the volume of the first resin 18a located in the second region. Also, the wirings 11a are unevenly disposed on the substrate 11 as described above, and for example, the area dimension of the portions of the wirings 11a disposed on the first recess 171 is larger than the area dimension of the portions of the wirings 11a disposed on the second recess 172. In other words, the area dimension of the wirings 11a in the first region 161 is larger than the area dimension of the wirings 11a in the second region 162. Hence, employing a material having better wettability by the first resin 18a than the wettability of the material of the substrate 11 for the outermost surfaces of the wirings 11a allows the first resin 18a to efficiently move toward the light-emitting elements 12 and the resin wall 150 located on the wirings 11a.

The first resin 18a may be made of, for example, a light-transmissive resin, but is preferably made of a light-shielding resin, more preferably a light-reflective resin. Such a resin can be appropriately selected from among the examples of the material of the resin wall described above. The first resin 18a may be made of a material that is different from, preferably the same as, the material used for the resin wall. The viscosity of the first resin 18a is preferably smaller than the viscosity in the case in which the resin wall is formed. The viscosity of the first resin 18a is, for example, 100 Pa·s or less, preferably 50 Pa·s or less, more preferably in the range of 4 Pa·s to 20 Pa·s, considering the ease of movement and ease of spreading.

The first resin 18a can be applied using any appropriate method known in the field of the invention as described above. For example, a discharging device (resin discharging device) configured to continuously discharge a liquid resin at a constant flow rate using air pressure or the like can be used (see Japanese Unexamined Patent Application Publication No. 2009-182307). In the case in which the discharging device is used, the moving speed of a needle of the discharging device is preferably constant.

In order to form the first recess 171 and the second recess 172, the amount of the first resin 18a applied to the first region 161 can be appropriately set according to, for example, the height of the first wall 151, the first distance D1, the length of one side of the light-emitting elements, and the number of the light-emitting elements arranged. The volume is in the range of, for example, 1.5 to 3 times of the capacity calculated by (the height of the first wall 151)×(the first distance D1)×(the length of the one side of the light-emitting elements×the number of the light-emitting elements arranged).

Forming Covering Member 18

Figure 1G:
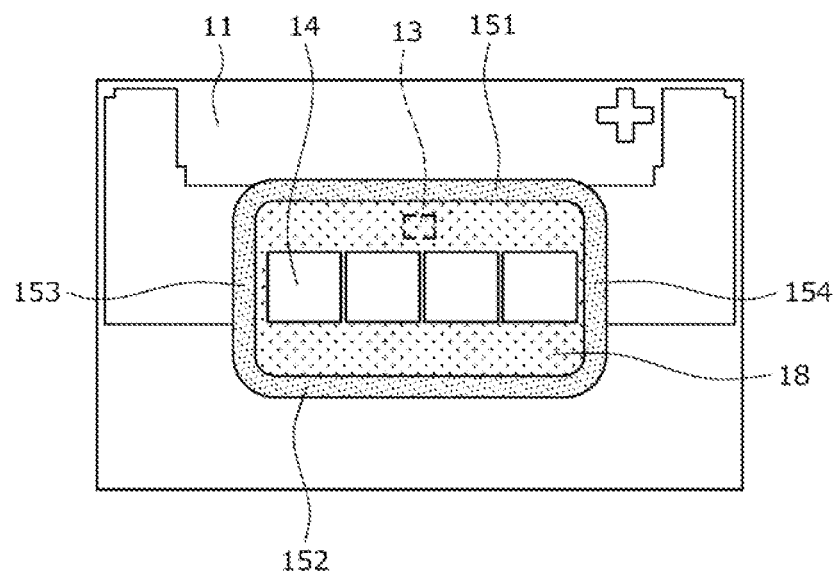
FIG. 1G is a schematic plan view illustrating the method of manufacturing a light-emitting device according to one embodiment of the present invention.
Figure 1H:
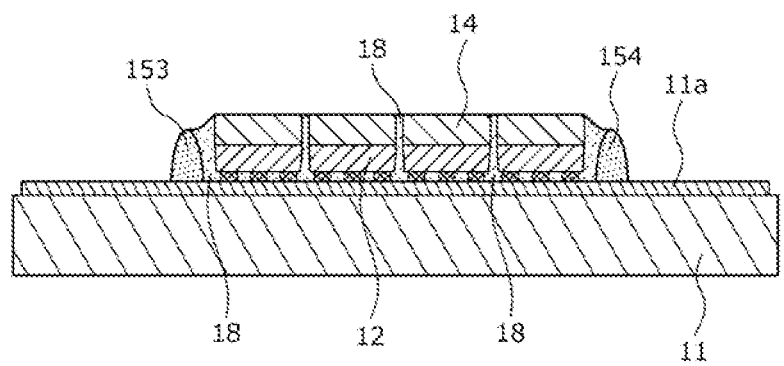
FIG. 1H is a schematic cross-sectional view of FIG. 1G.
Figure 2D:
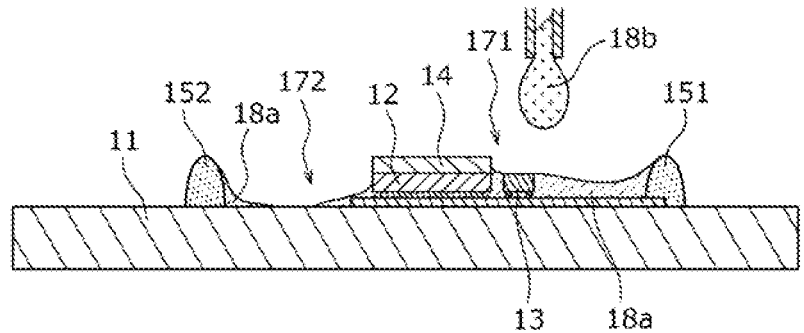
FIG. 2D is a schematic cross-sectional view illustrating the method of manufacturing a light-emitting device according to one embodiment of the present invention.
Figure 2E:
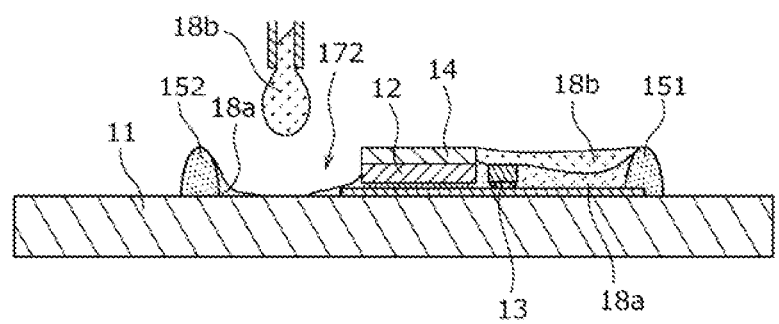
FIG. 2E is a schematic cross-sectional view illustrating the method of manufacturing a light-emitting device according to one embodiment of the present invention.

A second resin 18b is applied to the first recess 171 and the second recess 172 as shown in FIG. 2D and FIG. 2E. After the second resin 18b is applied, the first resin 18a and the second resin 18b are cured. A covering member 18 covering the lateral surfaces of the light-transmissive members 14 can thus be formed as shown in FIGS. 1G and 1H.

As described above, the capacity of the first recess 171 is smaller than the capacity of the second recess 172. Accordingly, the amount of the second resin applied to the first recess 171 is preferably smaller than the amount of the second resin applied to the second recess 172.

The first resin 18a and the second resin 18b are preferably cured in the same step. While the second resin 18b may be disposed after a step of curing the first resin 18a, it is preferable to successively apply the first resin 18a and the second resin 18b and to cure the first resin 18a and the second resin 18b at the same time.

The second resin 18b and the first resin 18a are preferably made of the same material. Using the same material for the first resin 18a and the second resin 18b allows for curing the first resin 18a and the second resin 18b under the same conditions at the same time.

By curing the first resin 18a and the second resin 18b at substantially the same time, the covering member 18 in which the first resin 18a and the second resin 18b are integrated is formed. This does not form an interface at the boundary between the first resin 18a and the second resin 18b, which improves adhesion between the first resin 18a and the second resin 18b, so that detachment can be reduced.

The second resin 18b can be applied using substantially the same method as used for applying the first resin 18a described above. The second resin 18b can be applied to the first recess 171 and the second recess 172 in any order.

Let the amount of the first resin applied to the first region be A, the amount of the second resin applied to the first recess be B, and the amount of the second resin applied to the second recess be C.

The amounts A, B, and C may be the same, any one of the amounts may differ from the others, or all the amounts may be different from one another. For example, in the case in which the area of the first region is substantially the same as the area of the second region, it is preferable to satisfy the amount A the amount C, and the amount A (≈C)>the amount B.

After the second resin 18b is applied to the first recess 171 and the second recess 172 that are formed by application of the first resin 18a, the first resin 18a and the second resin 18b are cured to form the covering member 18.

It is preferable that a surface of the covering member 18 be substantially flat in both of the first recess 171 and the second recess 172. It is preferable that the height of the surface of the covering member 18 from the substrate be substantially the same as or less than the height of the upper surfaces of the light-transmissive members 14.

As described above, in the present embodiment, the first resin 18a is disposed between the light-emitting elements and between the light-transmissive members to form the first recess 171 and the second recess 172 before the second resin 18b is applied. This allows for reducing movement of the second resin 18b between the first region 161 and the second region 162. That is, the movement of the second resin 18b to the gaps between adjacent light-transmissive members 14 is reduced, so that the second resin is effectively inhibited from creeping up the upper surfaces of the light-transmissive members 14. Also, formation of voids and the like between adjacent light-emitting elements and between adjacent light-transmissive members due to the movement of the resin is reduced, and the resin can be reliably filled in appropriate positions.

That is, as described above, the first recess and the second recess are formed by application of the first resin, and the second resin is applied to the first recess and the second recess in the present embodiment. Accordingly, the upper surface of the covering member 18 between the first recess and the second recess (that is, between the light-emitting elements 12 and between the light-emitting elements and the third and fourth walls) is constituted of the first resin 18a, and upper surfaces above the first recess and the second recess is constituted of the second resin 18b. On the other hand, by curing the first resin 18a and the second resin 18b at the same time, the covering member 18 in which the first resin 18a and the second resin 18b are integrated can be obtained. In the integrated covering member 18, there is no interface between the first resin 18a and the second resin 18b, so that cracks and resin cracks can be reduced. Accordingly, a reliable light-emitting device can be provided.

Figure 3:
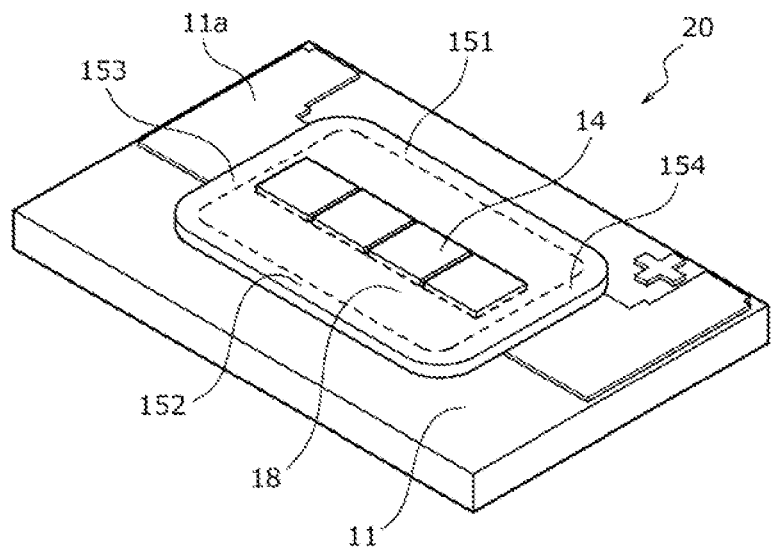
FIG. 3 is a schematic perspective view of light-emitting device manufactured in the method of manufacturing a light-emitting device according to one embodiment of the present invention.

Forming the covering member 18 in the manner described above allows for simply and reliably manufacturing the light-emitting device 20 in which the upper surfaces of the light-transmissive members 14 are exposed from the covering member 18 as shown in FIG. 3.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A method of manufacturing a light-emitting device, the method comprising:
    providing a first intermediate structure including
        a substrate,
        a plurality of light-emitting elements arrayed on an upper surface of the substrate in a first direction,
        a protective element disposed on the upper surface of the substrate, the protective element being spaced apart from an array of the light-emitting elements in a second direction orthogonal to the first direction and facing the array of the light-emitting elements, and a plurality of light-transmissive members respectively bonded to upper surfaces of the light-emitting elements;

forming a resin wall on the substrate to surround the light-emitting elements and the protective element, the resin wall including a first wall and a second wall extending along the first direction, and respectively disposed on sides of the array of the light-emitting elements with respect to the second direction with the protective element being disposed between the first wall and the array of the light-emitting elements, and a third wall and a fourth wall extending between the first wall and the second wall along the second direction, and respectively disposed on sides of the array of the light-emitting elements with respect to the first direction, a first distance between the first wall and the array of the light-emitting elements is larger than a second distance between the third wall and a corresponding one of the light-emitting elements facing the third wall or between the fourth wall and a corresponding one of the light-emitting elements facing the fourth wall;

applying a first resin to a first region between the first wall and the array of the light-emitting elements, in which the protective element is disposed, along the first direction to allow the first resin to move through gaps between the third wall and the corresponding one of the light-emitting elements, between the fourth wall and the corresponding one of the light-emitting elements, between adjacent ones of the light-emitting elements, and between the light-emitting elements and the substrate, resulting in forming a first recess in the first region and a second recess in a second region between the second wall and the array of the light-emitting elements, each of the first recess and the second recess being defined by inner lateral surfaces each constituted of the first resin or the resin wall; and forming a covering member covering lateral surfaces of the light-transmissive members by applying a second resin to the first recess and the second recess and curing the first resin and the second resin.

2. The method of manufacturing a light-emitting device according to claim 1, wherein the forming of the resin wall includes forming the resin wall so that the second distance is equal to or larger than a distance between adjacent ones of the light-emitting elements and smaller than three times the distance between the adjacent ones of the light-emitting elements.

3. The method of manufacturing a light-emitting device according to claim 1, wherein the forming of the resin wall includes forming the resin wall so that a distance between the second wall and the array of the light-emitting elements is equal to the first distance.

4. The method of manufacturing a light-emitting device according to claim 1, wherein the providing of the first intermediate structure includes providing the substrate including wirings on which the light-emitting elements and the protective element are disposed, and an area of portions of the wirings between the first wall and the array of the light-emitting elements is larger than an area of portions of the wirings between the second wall and the array of the light-emitting elements in a plan view.

5. The method of manufacturing a light-emitting device according to claim 1, wherein the applying of the second resin includes applying the second resin so that an amount of the second resin applied to the first recess is less than an amount of the second resin applied to the second recess.

6. The method of manufacturing a light-emitting device according to claim 1, wherein the forming of the resin wall includes forming the resin wall so that an upper end of the resin wall is located above the upper surfaces of the light-emitting elements and below upper surfaces of the light-transmissive members.

7. The method of manufacturing a light-emitting device according to claim 1, wherein the first resin and the second resin contain a light-reflective substance.

8. The method of manufacturing a light-emitting device according to claim 1, wherein the first resin and the second resin contain the same material.

9. The method of manufacturing a light-emitting device according to claim 1, wherein the providing of the first intermediate structure includes disposing the light-emitting elements on the substrate so that a distance between adjacent ones of the light-emitting elements is 0.1 to 0.5 times a length of one side of each of the light-emitting elements along the first direction.

10. The method of manufacturing a light-emitting device according to claim 1, wherein the providing of the first intermediate structure includes providing the light-transmissive members containing a phosphor.

\* \* \* \* \*